United States Patent
Ueno et al.

(10) Patent No.: US 9,436,094 B2
(45) Date of Patent: *Sep. 6, 2016

(54) STRIPPING SOLUTION FOR PHOTOLITHOGRAPHY AND PATTERN FORMATION METHOD

(71) Applicant: Tokyo Ohka Kogyo Co., Ltd., Kawasaki-shi (JP)

(72) Inventors: Naohisa Ueno, Kawasaki (JP); Daijiro Mori, Kawasaki (JP); Takayuki Haraguchi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/026,407

(22) Filed: Sep. 13, 2013

(65) Prior Publication Data

US 2014/0087313 A1    Mar. 27, 2014

(30) Foreign Application Priority Data

Sep. 24, 2012  (JP) .................................. 2012-210007

(51) Int. Cl.
*G03F 7/42* (2006.01)
(52) U.S. Cl.
CPC ..................................... *G03F 7/425* (2013.01)
(58) Field of Classification Search
CPC ..................................................... G03F 7/425
USPC .................. 430/313, 323, 329; 510/175, 176
See application file for complete search history.

(56) References Cited

U.S. PATENT DOCUMENTS

| | | |
|---|---|---|
| 5,792,274 A | 8/1998 | Tanabe et al. |
| 5,905,063 A | 5/1999 | Tanabe et al. |
| 6,638,899 B1 | 10/2003 | Wakiya et al. |
| 2002/0146647 A1* | 10/2002 | Aoki et al. ..................... 430/313 |
| 2004/0106531 A1* | 6/2004 | Kanno et al. .................. 510/175 |
| 2005/0176603 A1* | 8/2005 | Hsu .......................... G03F 7/423 510/175 |
| 2006/0014656 A1* | 1/2006 | Egbe et al. ................... 510/175 |

FOREIGN PATENT DOCUMENTS

| | | |
|---|---|---|
| JP | H9-197681 | 7/1997 |
| JP | 2000-047401 | 2/2000 |
| JP | 2000-181083 | 6/2000 |
| JP | 2001-83713 | 3/2001 |
| WO | WO 2006/129538 A1 | 12/2006 |

OTHER PUBLICATIONS

Office Action in Japanese Patent Application No. 2012-210007, dated Mar. 22, 2016.

* cited by examiner

*Primary Examiner* — Brittany Raymond
(74) *Attorney, Agent, or Firm* — Knobbe Martens Olson & Bear LLP

(57) ABSTRACT

A stripping solution for photolithography which can effectively strip away residual materials of a photoresist pattern and etching residual materials, and has excellent anticorrosion properties on $SiO_2$ and a variety of metal materials; and a method for forming a pattern using the stripping solution. A prescribed basic compound is used as a counter amine of the hydrofluoric acid contained in the stripping solution for photolithography, and the stripping solution for photolithography is adjusted to a pH measured at 23° C. of not more than 6.0 or 8.5 or more.

10 Claims, 4 Drawing Sheets

STRIPPING SOLUTION FOR PHOTOLITHOGRAPHY AND PATTERN FORMATION METHOD

CROSS-REFERENCE TO RELATED APPLICATION

This application is claims the priority to Japanese Patent Application No. 2012-210007, filed Sep. 24, 2012, the entire content of which is incorporated herein by reference.

BACKGROUND OF THE INVENTION

1. Field of the Invention

The present invention relates to a stripping solution for photolithography which can be suitably used in manufacture of semiconductor elements such as IC and LSI and liquid crystal panel elements and to a method for forming a pattern using the same.

2. Related Art

When semiconductor elements such as IC and LSI or liquid crystal panel elements are manufactured, a CVD vapor-deposited metal film or an insulating film such as an $SiO_2$ film is first formed on a substrate such as a silicon wafer and glass. Subsequently, a photoresist composition is uniformly applied on the metal film or insulating film to form a photoresist film, and this photoresist film is selectively exposed and developed to form a photoresist pattern. Then, the substrate is subjected to an etching treatment using this photoresist pattern as a mask to form a fine circuit. Thereafter, the photoresist pattern is ashed, and residual materials of the ashed photoresist pattern and etching residual materials are stripped away using a stripping solution for photolithography.

It is to be noted that aluminum (Al); an aluminum alloy (Al alloy) such as aluminum-silicon (Al—Si), aluminum-copper (Al—Cu), and aluminum-silicon-copper (Al—Si—Cu); titanium (Ti); a titanium alloy (Ti alloy) such as titanium nitride (TiN) and titanium tungsten (TiW); tantalum (Ta); tantalum nitride (TaN); tungsten (W); tungsten nitride (WN); copper (Cu); or the like may be used as the above-described metal film. In addition, an $SiO_2$ film is often used as the insulating film. The metal film and insulating film are formed as a single layer or a plurality of layers on the substrate.

The stripping solution for photolithography is desired to be able to effectively strip away residual materials of a photoresist pattern and etching residual materials and to have excellent anticorrosion properties on metals. In order to achieve both of the performances, use of hydrofluoric acid and a compound containing ammonia as a counter amine thereof (see Patent Documents 1 to 3), hydrofluoric acid and a compound using 1,8-diazabicyclo[5.4.0]undecene-7 as a counter amine thereof (see Patent Document 4), or the like has been proposed so far.

Patent Document 1: Japanese Unexamined Patent Application, Publication No. 2001-83713
Patent Document 2: Japanese Unexamined Patent Application, Publication No. H9-197681
Patent Document 3: Japanese Unexamined Patent Application, Publication No. 2000-47401
Patent Document 4: Japanese Unexamined Patent Application, Publication No. 2000-181083

SUMMARY OF THE INVENTION

But, the stripping solutions for photolithography described in Patent Documents 1 to 4 were insufficient in anticorrosion properties depending upon the kind of a metal material. In addition, as described above, in manufacturing semiconductor elements such as IC and LSI or liquid crystal panel elements, the $SiO_2$ film was often formed on the substrate; however, the stripping solutions for photolithography described in Patent Documents 1 to 4 were those which are liable to corrode $SiO_2$.

The present invention has been made in view of the foregoing problems, and an object of the present invention is to provide a stripping solution for photolithography which can effectively strip away residual materials of a photoresist pattern and etching residual materials and has excellent anticorrosion properties on $SiO_2$ and a variety of metal materials; and a method for forming a pattern using the stripping solution.

The present inventors have found that the foregoing problems can be solved by not only using a prescribed basic compound as a counter amine of hydrofluoric acid contained in a stripping solution for photolithography but adjusting a pH of the stripping solution for photolithography to a specified range, leading to accomplishment of the present invention. More specifically, provided by the present invention are as in the following.

A first aspect of the present invention provides a stripping solution for photolithography containing (A) hydrofluoric acid, (B) a basic compound represented by the following general formula (b-1), and (C) water and having a pH at 23° C. of not more than 6.0 or 8.5 or more.

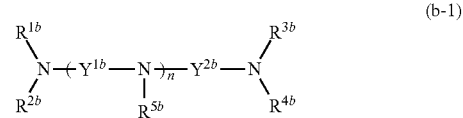

(b-1)

In the general formula (b-1),
$R^{1b}$ to $R^{5b}$ each independently represent a hydrogen atom or an alkyl group having from 1 to 6 carbon atoms, which may be substituted with a hydroxyl group, a carboxyl group, an amino group, or a phosphonic acid group, provided that at least one of $R^{1b}$ to $R^{5b}$ represents a hydrogen atom, and one of $R^{1b}$ to $R^{4b}$ may bind with $R^{5b}$ to form a ring structure;
$Y^{1b}$ and $Y^{2b}$ each independently represent an alkylene group having from 1 to 3 carbon atoms;
n is an integer of from 0 to 5; and
when n is 2 or greater, a plurality of $R^{5b}$s may be the same as or different from each other, a plurality of $Y^{1b}$s may be the same as or different from each other, and $R^{5b}$s may bind with each other to form a ring structure.

A second aspect of the present invention provides a method for forming a pattern, which includes etching a substrate using a photoresist pattern provided on the substrate as a mask; then ashing the photoresist pattern; and thereafter stripping away residual materials of the photoresist pattern and etching residual materials using the stripping solution for photolithography according to the first aspect of the present invention.

According to the present invention, a stripping solution for photolithography which can effectively strip away residual materials of a photoresist pattern and etching residual materials and has excellent anticorrosion properties on $SiO_2$ and a variety of metal materials; and a method for forming a pattern using the stripping solution can be provided.

DETAILED DESCRIPTION OF THE INVENTION

Stripping Solution for Photolithography

Figure 1:
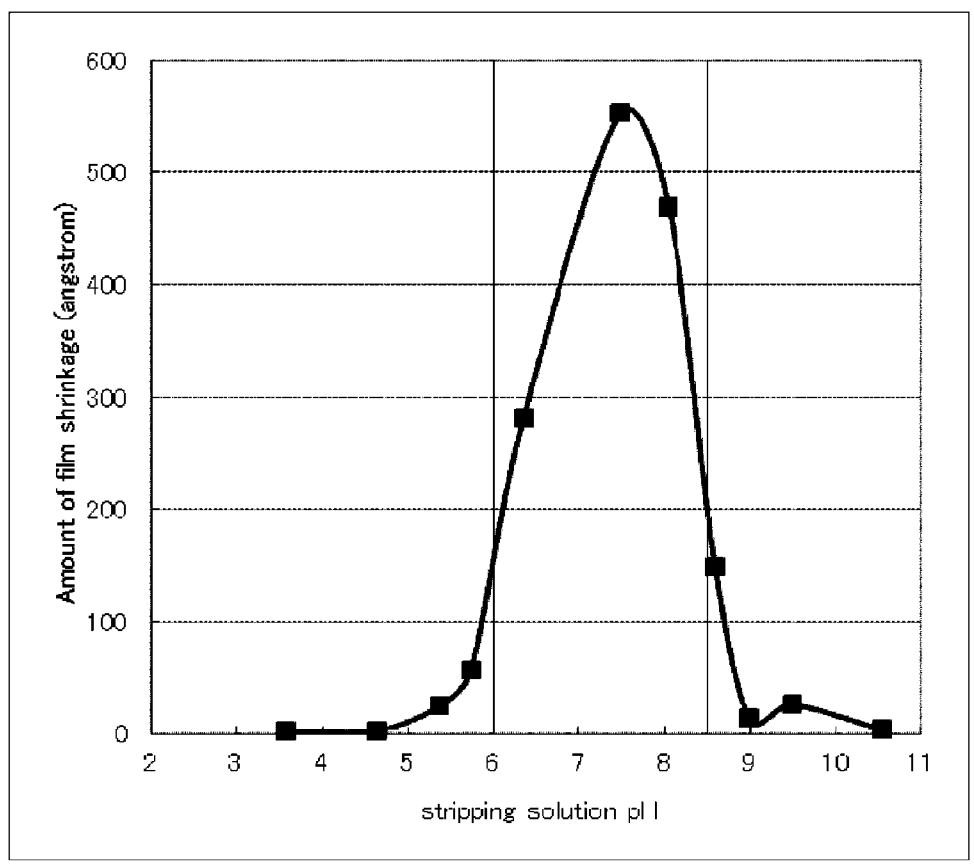
FIG. 1 is a graph showing a relation between a pH of a stripping solution containing diethylenetriamine and an amount of film shrinkage of $SiO_2$ in the case of immersing a substrate made of $SiO_2$ as a material quality of the surface thereof in the stripping solution.

The stripping solution for photolithography according to the present invention (hereinafter, merely referred to as "stripping solution") contains (A) hydrofluoric acid, (B) a basic compound, and (C) water. In addition, the stripping solution for photolithography of the present invention has a pH at 23° C. of not more than 6.0 or 8.5 or more.

The stripping solution for photolithography may contain (D) a pH adjuster for adjusting the pH to a prescribed value. In addition, the stripping solution for photolithography may contain (E) a water-soluble organic solvent. Each of the components contained in the stripping solution according to the present invention is hereunder described in detail.

(A) Hydrofluoric Acid

The stripping solution according to the present invention essentially contains hydrofluoric acid.

A content of hydrofluoric acid in the stripping solution is preferably from 0.05 to 0.5% by mass, and more preferably from 0.08 to 0.32% by mass. When the content of hydrofluoric acid falls within such a range, stripping properties of residual materials of a photoresist pattern and etching residual materials can be more effectively balanced with anticorrosion properties on metals.

(B) Basic Compound

The stripping solution according to the present invention essentially contains a basic compound represented by the following general formula (b-1).

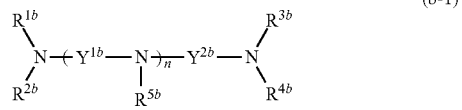

(b-1)

In the general formula (b-1), $R^{1b}$ to $R^{5b}$ each independently represent a hydrogen atom or an alkyl group having from 1 to 6 carbon atoms, which may be substituted with a hydroxyl group, a carboxyl group, an amino group, or a phosphonic acid group, provided that at least one of $R^{1b}$ to $R^{5b}$ represents a hydrogen atom, and one of $R^{1b}$ to Rob may bind with $R^{5b}$ to form a ring structure;

$Y^{1b}$ and $Y^{2b}$ each independently represent an alkylene group having from 1 to 3 carbon atoms;

n is an integer of from 0 to 5; and when n is 2 or greater, a plurality of $R^{5b}$s may be the same as or different from each other, a plurality of $Y^{1b}$s may be the same as or different from each other, and $R^{5b}$s may bind with each other to form a ring structure.

The alkyl group having from 1 to 6 carbon atoms which $R^{1b}$ to $R^{5b}$ may be may be either linear or branched, and is preferably linear. Specific examples of the alkyl group having from 1 to 6 carbon atoms include a methyl group, an ethyl group, an n-propyl group, an n-butyl group, an n-pentyl group, an n-hexyl group, and the like. Of these, an ethyl group is most preferred.

The alkyl group may be substituted with a hydroxyl group, a carboxyl group, an amino group, or a phosphonic acid group. Specific examples of such a substituted alkyl group include a 2-hydroxyethyl group, a 2-carboxyethyl group, a 2-aminoethyl group, an ethyl 2-phosphonate group, and the like.

Examples of the ring structure which may be formed by binding of one of $R^{1b}$ to $R^{4b}$ with $R^{5b}$, or the ring structure which may be formed by binding of $R^{5b}$s with each other, include a piperazine ring and the like.

The alkylene group having from 1 to 3 carbon atoms which $Y^{1b}$ and $Y^{2b}$ may be may be either linear or branched, and is preferably linear. Specific examples of the alkylene group having from 1 to 3 carbon atoms include a methylene group, an ethylene group, a propylene group, and the like. Of these, an ethylene group is most preferred.

"n" is an integer of from 0 to 5, and more preferably an integer of from 0 to 2.

Specific examples of the basic compound represented by the foregoing general formula (b-1) include ethylenediamine, N-(2-aminoethyl)-1,2-ethanediamine (i.e., diethylenetriamine), N,N'-bis(2-aminoethyl)-1,2-ethanediamine (i.e., triethylenetetramine), tris(2-aminoethyl)amine, N,N'-bis(2-aminoethyl)piperazine, N-[(2-aminoethyl)-2-aminoethyl]piperazine, N-(2-aminoethyl)-N'-{2-[(2-aminoethyl)amino]ethyl}-1,2-ethanediamine (i.e., tetraethylenepentamine), 4-(2-aminoethyl)-N-(2-aminoethyl)-N'-{2-[(2-aminoethyl)amino]ethyl}-1,2-ethanediamine, 1-(2-aminoethyl)-4-{[(2-aminoethyl)amino]ethyl}piperazine, 1-{2-[[2-[(2-aminoethyl)amino]ethyl]amino]ethyl}piperazine, 1-piperazineethaneamine, 2-[(2-aminoethyl)amino]ethanol, diethylenetriamine pentaacetic acid, and the like.

Among the basic compounds represented by the foregoing general formula (b-1), basic compounds represented by the following general formula (b-2) are preferred.

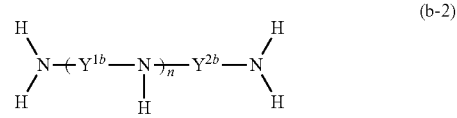

(b-2)

In the general formula (b-2), $Y^{1b}$, $Y^{2b}$, and n are synonymous with those in the foregoing general formula (b-1).

Specific examples of the basic compound represented by the foregoing general formula (b-2) include ethylenediamine, N-(2-aminoethyl)-1,2-ethanediamine (i.e., diethylenetriamine), N,N'-bis(2-aminoethyl)-1,2-ethanediamine (i.e., triethylenetetramine), tetraethylenepentamine, pentaethylenehexamine, dimethylenetriamine, trimethylenetetramine, and the like.

Of these, N-(2-aminoethyl)-1,2-ethanediamine (i.e., diethylenetriamine) and N,N'-bis(2-aminoethyl)-1,2-ethanediamine (i.e., triethylenetetramine) are especially preferred from the standpoint that they have high anticorrosion properties on metals and are able to be continuously used for a longer period of time.

These basic compounds may be used alone, or may be used in combination of two or more kinds thereof.

Though a content of the basic compound represented by the foregoing general formula (b-1) may be appropriately adjusted in accordance with the content of the hydrofluoric acid, it is preferably from 0.01 to 2.00% by mass, and more preferably from 0.01 to 1.24% by mass in the stripping solution. In addition, a ratio of the normality (N) of the basic compound to the normality (N) of the hydrofluoric acid is preferably from 0.1 to 3.0, and more preferably from 0.1 to 1.5. When the ratio falls within such a range, stripping properties of residual materials of a photoresist pattern and etching residual materials can be more effectively balanced with anticorrosion properties on metals, and furthermore, the stripping solution is able to be continuously used for a longer period of time.

(C) Water

The stripping solution according to the present invention essentially contains water.

A content of water in the stripping solution is preferably from 1.0 to 80% by mass, and more preferably from 15 to 40% by mass.

(D) pH Adjuster

In order to allow the stripping solution according to the present invention to have a pH measured at 23° C. of not more than 6.0 or 8.5 or more, it may contain a pH adjuster. The kind of the pH adjuster is not limited within the range where the object of the present invention is not impaired as long as it is able to adjust the pH of the stripping solution to a desired value, and it can be appropriately selected among a variety of conventionally known pH adjusters. When the pH adjuster is a basic compound, amine based compounds and metal-containing basic compounds are preferred.

It is to be noted that when the pH adjuster is one which adjusts the pH of the stripping solution to a basic side, the pH adjuster is a basic compound other than the basic compound which is used as the component (B). In addition, when the pH adjuster is one which adjusts the pH of the stripping solution to an acidic side, the pH adjuster is an acidic compound other than the hydrofluoric acid as the component (A).

Specific examples of the acidic compound which is used as the pH adjuster include sulfuric acid, nitric acid, hydrochloric acid, hydrobromic acid, phosphoric acid, formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid, citric acid, acetic anhydride, phthalic anhydride, maleic anhydride, succinic anhydride, salicylic acid, p-hydroxybenzoic acid, 2,4-dihydroxybenzoic acid, 2,5-dihydroxybenzoic acid, 3,4-dihydroxybenzoic acid, 3,5-dihydroxybenzoic acid, methanesulfonic acid, benzenesulfonic acid, p-toluenesulfonic acid, and the like.

Specific examples of the amine based compound which is used as the pH adjuster include hydroxylamines such as hydroxylamine and N,N-diethylhydroxylamine; primary aliphatic amines such as monoethanolamine; secondary aliphatic amines such as diethanolamine, dipropylamine, N-methylethanolamine, and 2-ethylaminoethanol; tertiary amines such as dimethylaminoethanol, ethyldiethanolamine, triethanolamine, and triethylamine; alicyclic amines such as cyclohexylamine and dicyclohexylamine; aromatic amines such as benzylamine, dibenzylamine, and N-methylbenzylamine; and heterocyclic amines such as pyrrole, pyrrolidine, pyrrolidone, pyridine, morpholine, pyrazine, piperidine, N-hydroxyethylpiperidine, oxathiazole, and thiazole.

Examples of the metal-containing basic compound which is used as the pH adjuster include alkali metal hydroxides such as sodium hydroxide, potassium hydroxide, and lithium hydroxide; alkali metal carbonates such as sodium carbonate, potassium carbonate, and lithium carbonate; alkali metal bicarbonates such as sodium hydrogencarbonate, potassium hydrogencarbonate, and lithium hydrogencarbonate; alkali metal hydrides such as lithium hydride, sodium hydride, and potassium hydride; and alkali metal alkoxides such as sodium methoxide and sodium ethoxide.

A content of the pH adjuster in the stripping solution is not particularly limited within the range where the object of the present invention is not impaired. The pH adjuster is used in an amount such that the stripping solution has a desired pH.

(E) Water-Soluble Organic Solvent

The stripping solution according to the present invention may further contain a water-soluble organic solvent.

The water-soluble organic solvent is not particularly limited as long as it is miscible with water and other components, and a conventionally well-known water-soluble organic solvent may be used. Specific examples of the water-soluble organic solvent include sulfoxides such as dimethyl sulfoxide; sulfones such as dimethyl sulfone, diethyl sulfone, bis(2-hydroxyethyl)sulfone, and tetramethylene sulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; lactones such as γ-butyrolactone and δ-valerolactone; polyhydric alcohols and derivatives thereof such as ethylene glycol, propylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, and diethylene glycol monobutyl ether; and the like.

Of these, dimethyl sulfoxide, N,N-dimethylformamide, N,N-dimethylacetamide, N-methyl-2-pyrrolidone, 1,3-dimethyl-2-imidazolidinone, ethylene glycol, propylene glycol, and diethylene glycol monobutyl ether are preferred; and dimethyl sulfoxide, N,N-dimethylformamide, N,N-dimethylacetamide, N-methyl-2-pyrrolidone, 1,3-dimethyl-2-imidazolidinone, and propylene glycol are especially preferred from the standpoint of excellent stripping properties of residual materials of a photoresist pattern and etching residual materials.

These water-soluble organic solvents may be used alone, or may be used in combination of two or more kinds thereof.

When the water-soluble organic solvent is contained, its content in the stripping solution is preferably from 1.0 to 90% by mass, and more preferably from 60 to 80% by mass.

Other Component

The stripping solution according to the present invention may further contain an anticorrosion agent.

The anticorrosion agent is not particularly limited, and a conventionally well-known anticorrosion agent may be used. The anticorrosion agent is preferably a benzotriazole based compound or a mercapto group-containing compound.

Examples of the benzotriazole based compound include compounds represented by the following general formula (f-1).

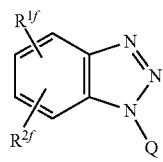

(f-1)

In the foregoing general formula (f-1), $R^{1f}$ and $R^{2f}$ each independently represent a hydrogen atom, a hydrocarbon group having from 1 to 10 carbon atoms which may include a substituent, a carboxyl group, an amino group, a hydroxyl group, a cyano group, a formyl group, a sulfonylalkyl group, or a sulfo group; and Q represents a hydrogen atom, a hydroxyl group, a hydrocarbon group having from 1 to 14 carbon atoms which may include a substituent (wherein the hydrocarbon group may be interrupted by an amide bond or an ester bond), or a group represented by the following general formula (f-2).

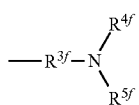

(f-2)

In the foregoing general formula (f-2), $R^{3f}$ represents an alkylene group having from 1 to 6 carbon atoms; and $R^{4f}$ and $R^{5f}$ each independently represent a hydrogen atom, a hydroxyl group, or a hydroxyalkyl group or an alkoxyalkyl group each having from 1 to 6 carbon atoms.

It is to be noted that in each of the definitions of $R^{1f}$, $R^{2f}$, and Q in the foregoing general formula (f-1), the hydrocarbon group may be either an aromatic hydrocarbon group or an aliphatic hydrocarbon group, may include an unsaturated bond, and may be a linear, branched or cyclic hydrocarbon group. Examples of the aromatic hydrocarbon group include a phenyl group, a p-tolyl group, and the like. Examples of the linear aliphatic hydrocarbon group include a methyl group, an n-propyl group, a vinyl group, and the like. Examples of the branched aliphatic hydrocarbon group include an isobutyl group, a tert-butyl group, and the like. Examples of the cyclic aliphatic hydrocarbon group include a cyclopentyl group, a cyclohexyl group, and the like. Examples of the hydrocarbon group including a substituent include a hydroxyalkyl group, an alkoxyalkyl group, and the like.

In addition, Q in the foregoing general formula (f-1) is preferably a group represented by the foregoing general formula (f-2). In particular, among the groups represented by the foregoing general formula (f-2), it is preferred that $R^{4f}$ and $R^{5f}$ are each independently selected from a hydroxyalkyl group or an alkoxyalkyl group each having from 1 to 6 carbon atoms.

Furthermore, Q is preferably selected such that the compound represented by the foregoing general formula (f-1) exhibits water-soluble properties. Specifically, a hydrogen atom, an alkyl group having from 1 to 3 carbon atoms (i.e., a methyl group, an ethyl group, a propyl group, or an isopropyl group), a hydroxyalkyl group having from 1 to 3 carbon atoms, a hydroxyl group, and the like are preferred.

Specifically, examples of the benzotriazole based compound include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazolecarboxylate, 5-benzotriazolecarboxylic acid, 1-methoxy-benzotriazole, 1-(2,2-dihydroxyethyl)benzotriazole, 1-(2,3-dihydroxypropyl)benzotriazole; and 2,2'-{[(4-methyl-1H-benzotriazol-1-yl)methyl]imino}bisethanol, 2,2'-{[(5-methyl-1H-benzotriazol-1-yl)methyl]imino}bisethanol, 2,2'-{[(4-methyl-1H-benzotriazol-1-yl)methyl]imino}bisethane, 2,2'-{[(4-methyl-1H-benzotriazol-1-yl)methyl]imino}bispropane, and the like that are commercially available from BASF as "IRGAMET" series.

Of these, 1-(2,3-dihydroxypropyl)benzotriazole, 2,2'-{[(4-methyl-1H-benzotriazol-1-yl)methyl]imino}bisethanol, 2,2'-{[(5-methyl-1H-benzotriazol-1-yl)methyl]imino}bisethanol, and the like are preferable.

These benzotriazole compounds may be used alone, or may be used in combination of two or more kinds thereof.

The mercapto group-containing compound is preferably a compound containing a hydroxyl group and/or a carboxyl group on at least one of the α-position and the β-position of a carbon atom that is bonded to the mercapto group. Specifically, examples of such a compound include 1-thioglycerol, 3-(2-aminophenylthio)-2-hydroxypropylmercaptan, 3-(2-hydroxyethylthio)-2-hydroxypropylmercaptan, 2-mercaptopropionic acid, 3-mercaptopropionic acid, and the like. Above all, it is especially preferred to use 1-thioglycerol.

These mercapto group-containing compounds may be used alone, or may be used in combination of two or more kinds thereof.

When the anticorrosion agent is contained, its content in the stripping solution is preferably from 0.1 to 10% by mass, and more preferably from 0.5 to 5% by mass.

In addition, the stripping solution according to the present invention may further contain a surfactant.

The surfactant is not particularly limited, and a conventionally well-known surfactant may be used. The surfactant is preferably an acetylene alcohol based surfactant.

When the surfactant is contained, its content in the stripping solution is preferably from 0.01 to 5% by mass, and more preferably from 0.05 to 2% by mass.

In view of the fact that the stripping solution according to the present invention essentially contains the above-described components (A) to (C) and has a pH of not more than 6.0 or 8.5 or more, and preferably not more than 5.0 or 9.0 or more, it is able to make both stripping properties of residual materials of a photoresist pattern and etching residual materials and anticorrosion properties on $SiO_2$ and metals (particularly Al and Al alloys) compatible with each other. Therefore, the stripping solution according to the present invention can be, for example, suitably used in forming a metal wiring pattern on a substrate provided with an insulating film made of $SiO_2$.

Method for Forming a Pattern

The method for forming a pattern according to the present invention includes etching a substrate using a photoresist pattern provided on the substrate as a mask; then ashing the photoresist pattern; and thereafter stripping away residual materials of the photoresist pattern and etching residual materials using the stripping solution according to the present invention. An example of the method for forming a pattern according to the present invention is hereunder described in detail.

First of all, a photoresist composition is applied on a substrate on which a metal film has been formed, and the photoresist composition is dried to form a photoresist film.

Examples of the substrate on which a metal film has been formed include substrates on which a metal film has been formed. Examples of the metal include aluminum (Al); an aluminum alloy (Al alloy) such as aluminum-silicon (Al—Si), aluminum-copper (Al—Cu), and aluminum-silicon-copper (Al—Si—Cu); titanium (Ti); a titanium alloy (Ti alloy) such as titanium nitride (TiN) and titanium tungsten (TiW); tantalum (Ta); tantalum nitride (TaN); tungsten (W); tungsten nitride (WN); copper (Cu); and the like. The method for forming a pattern according to the present invention is particularly suited in the case where a metal film made of Al or an Al alloy has been formed on a substrate.

In addition, the substrate on which a metal film has been formed may be provided with an $SiO_2$ film for the purpose of insulation or the like. In the method for forming a pattern according to the present invention, since the above-described stripping solution is used, the corrosion of the $SiO_2$ film together with the metal film can be suppressed.

In addition, examples of the photoresist composition include (i) a positive photoresist composition containing a naphthoquinonediazide compound and a novolak resin; (ii) a positive photoresist composition containing a compound that generates an acid by exposure, a compound that increases its solubility in an aqueous alkali solution through decomposition by an acid, and an alkali-soluble resin; (iii) a positive photoresist composition containing a compound that generates an acid by exposure and an alkali-soluble resin having a group that increases its solubility in an aqueous alkali solution through decomposition by an acid; (iv) a negative photoresist composition containing a compound that generates an acid by exposure, a crosslinking agent, and an alkali-soluble resin; and the like. However, the photoresist composition is not limited thereto.

Subsequently, the photoresist film is selectively exposed. The exposure may be carried out on the photoresist film with a light source that emits an actinic radiation such as an ultraviolet ray, a far ultraviolet ray, an excimer laser, an X-ray, and an electron beam, for example, a low-pressure mercury vapor lamp, a high-pressure mercury vapor lamp, an ultrahigh-pressure mercury vapor lamp, a xenon lamp, or the like, through a desired mask pattern, or the photoresist film may be irradiated directly with an electron beam.

Thereafter, a heat treatment (PEB) is carried out as the need arises.

Subsequently, the exposed photoresist film is developed with a developer solution to obtain a prescribed photoresist pattern. Examples of the development method include an immersion method, a puddle method, a spray coating method, and the like.

Thereafter, a heat treatment (post-baking) is carried out as the need arises.

Subsequently, using the formed photoresist pattern as a mask, the metal film is selectively etched. Though the etching may be either one of wet etching and dry etching, or a combination of both, dry etching is preferred.

Subsequently, the photoresist pattern is ashed.

It is to be noted that etching residual materials and residual materials of a modified photoresist pattern often remain on the ashed substrate.

Subsequently, the residual materials of a photoresist pattern and etching residual materials are stripped away using the stripping solution according to the present invention. When a metal film made of Al or an Al alloy is formed on the substrate, examples of the residual material include $Al_2O_3$, $AlCl_3$, $AlF_3$, $SiO_2$, and the like. Examples of the stripping method include an immersion method, a spray coating method, and the like, and the treatment may be carried out by either a batchwise processing or a single wafer processing. Though a stripping time is not particularly limited, it is generally from about 10 to 30 minutes in a batchwise processing and about from 0.5 to 3 minutes in a single wafer processing, respectively. The stripping solution according to the present invention is preferably used in a single wafer processing. Though a temperature of the stripping solution is not particularly limited, it is generally from about 25 to 70° C.

Thereafter, a rinse treatment with pure water, a lower alcohol, or the like, and a dry treatment may be also carried out.

According to the foregoing steps, it is possible to form a metal wiring pattern on the substrate.

Examples

The present invention is hereunder described in more detail by way of Examples of the present invention, but it should not be construed that the present invention is limited to the following Examples.

(Preparation of Stripping Solution)

Stripping solutions were prepared in accordance with compositions and amounts blended as shown in the following Table 1. Values in parentheses in the table represent a part by mass. In addition, pH values of the stripping solutions of the respective Examples and Comparative Examples in the table are values measured at 23° C.

TABLE 1

| | Hydrofluoric acid | Basic compound | pH adjuster | Water | Water-soluble organic solvent | pH |
|---|---|---|---|---|---|---|
| Comparative Example 1 | HF (0.11) | — | — | Water (25.2) | NMP (74.8) | 5.5 |
| Comparative Example 2 | HF (0.11) | DETA (0.050) | — | Water (25.2) | NMP (74.8) | 6.4 |
| Comparative Example 3 | HF (0.11) | TETA (0.027) | — | Water (25.2) | NMP (74.8) | 6.1 |
| Example 1 | HF (0.11) | DETA (0.050) | CA (0.100) | Water (25.2) | NMP (74.8) | 5.7 |
| Example 2 | HF (0.11) | TETA (0.027) | CA (0.100) | Water (25.2) | NMP (74.8) | 5.4 |

Abbreviations in the foregoing Table 1 are as shown below.
DETA: Diethylenetriamine
TETA: Triethylenetetramine
CA: Citric acid
NMP: N-Methyl-2-pyrrolidone Evaluation of Anticorrosion Properties of $SiO_2$ In the case of immersing a substrate made of $SiO_2$ as a material quality of the surface thereof in each of the stripping solutions of Examples 1 to 2 and Comparative Examples 1 to 3 in a beaker, an amount of film shrinkage of $SiO_2$ (angstrom) of the substrate surface was measured. An immersion treatment temperature was 35° C., and an immersion time was 30 minutes. After the immersion treatment of the substrate in the stripping solution, the substrate was cleaned with ion-exchanged distilled water, a nitrogen gas was sprayed onto the cleaned substrate, and the substrate was dried. The amount of film shrinkage of $SiO_2$ (angstrom) in the case of using each of the stripping solutions is shown in the following Table 2.

Figure 3:
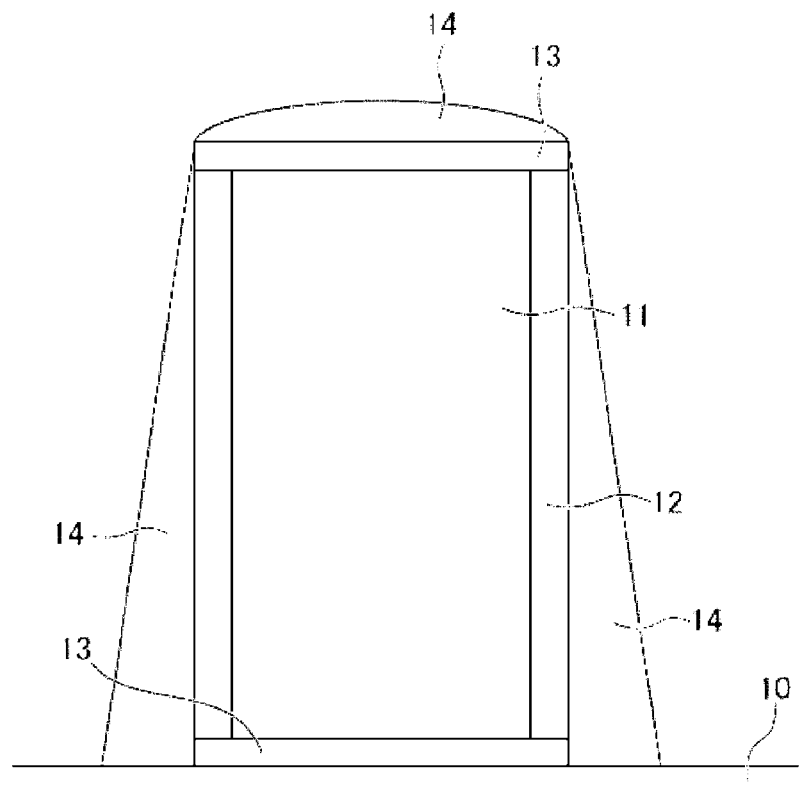
FIG. 3 is a schematic view of a cross section of a substrate in which an aluminum wiring in a state where an aluminum film is etched with a photoresist pattern as a mask, and the photoresist pattern is then ashed is formed.

Evaluation of Stripping Properties of Etching Residual Materials and Anticorrosion Properties on Substrate Having a Wiring Formed Thereon On the surface of a substrate in which an SiO$_2$ film was formed on the surface thereof, and a TiN thin film, an Al film, and a TiN thin film were laminated in this order on the SiO$_2$ film, a photoresist composition was applied, and a pattern was formed by a well-known method. It is to be noted that an Al—Cu alloy containing a small amount of copper was used as a material of the Al film. The substrate having a photoresist pattern formed thereon was subjected to a well-known etching treatment to etch the laminated film made of a TiN thin film, an Al film, and a TiN thin film, thereby forming an Al wiring pattern. Subsequently, an ashing treatment was carried out by a well-known method to obtain a substrate in which an aluminum wiring made of an Al—Cu alloy containing a small amount of copper was formed on the surface thereof. A schematic view of the ashed substrate is shown in FIG. 3.

Figure 4:
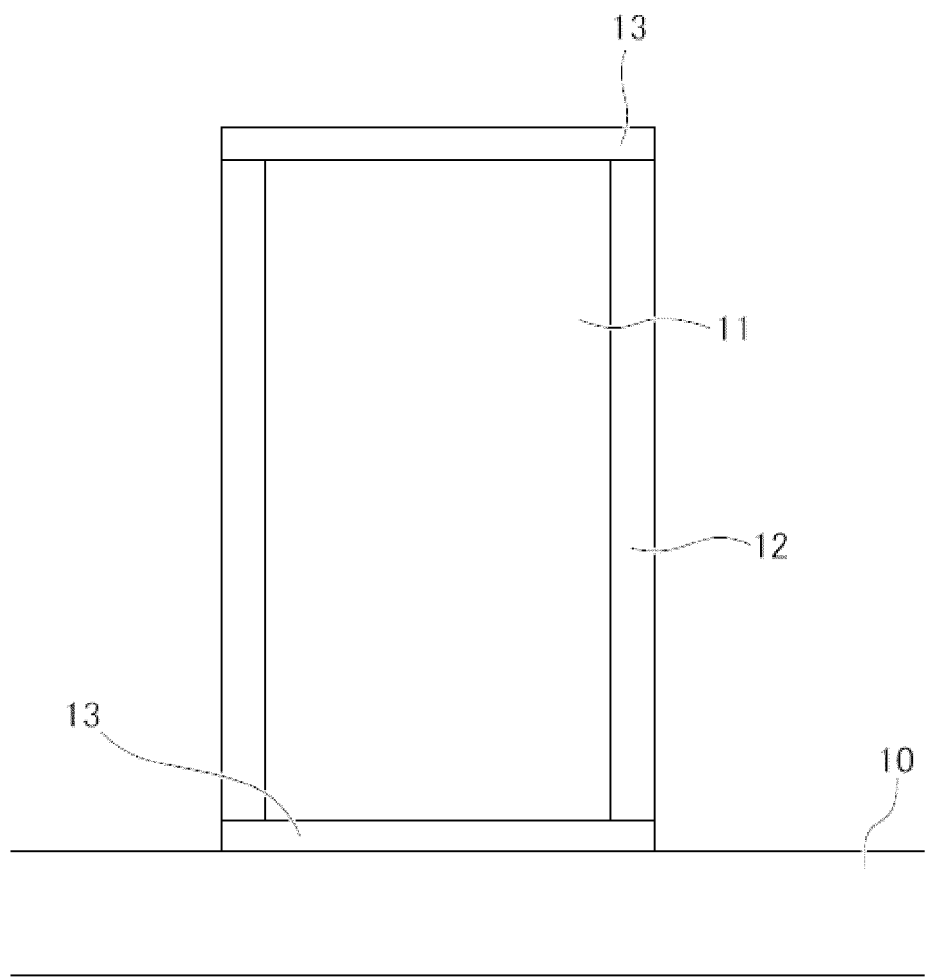
FIG. 4 is a schematic view of a cross section of a substrate in which an aluminum wiring in a state where an aluminum film is etched with a photoresist pattern as a mask, and the photoresist pattern is then ashed is formed, the substrate being further cleaned with a stripping solution.

Subsequently, the ashed substrate was heated to 35° C. by a single wafer processing and immersed in each of the stripping solutions of Examples 1 to 2 and Comparative Examples 1 to 3 for one minute and 5 minutes, respectively, thereby stripping away residual materials of a photoresist pattern and etching residual materials. A schematic view of the substrate after stripping away residual materials is shown in FIG. 4.

The substrate having an aluminum wiring pattern formed thereon after stripping away the residual materials was observed by an optical microscope and a scanning electron microscope (SEM), thereby evaluating stripping properties and anticorrosion properties. The stripping properties were evaluated as: "A" when residual materials of a photoresist pattern and etching residual materials did not remain; and "B" when the residual materials remained. In addition, the anticorrosion properties were evaluated as: "A" when the corrosion was not observed on the side surface of the aluminum wiring pattern; "B" when the corrosion was observed to an extent that the pattern discolored; and "C" when an anticorrosion effect was not brought, and the corrosion was observed. The evaluation results are shown in Table 2. It is to be noted that in this test, the immersion time was short so that the corrosion was not observed in a portion between the aluminum wirings where SiO$_2$ was exposed.

TABLE 2

| | | Al wiring | | | |
| | | Treatment time: one minute | | Treatment time: 5 minutes | |
| | SiO$_2$ film | | | | |
| | pH | Amount of film shrinkage (angstrom) | Stripping properties | Corrosion of Al wiring | Stripping properties | Corrosion of Al wiring |
|---|---|---|---|---|---|---|
| Comparative Example 1 | 5.5 | 38.9 | A | C | A | C |
| Comparative Example 2 | 6.4 | 195.6 | A | A | A | B |
| Comparative Example 3 | 6.1 | 183.2 | A | A | A | B |
| Example 1 | 5.7 | 33.4 | A | A | A | A |
| Example 2 | 5.4 | 32.9 | A | A | A | A |

According to Table 2, it is understood that in accordance with a stripping solution containing (A) hydrofluoric acid and (B) a basic compound having a prescribed structure and having a pH adjusted to not more than 6.0, it is possible to make both good stripping of residual materials of a photoresist pattern and etching residual materials and anticorrosion of an aluminum wiring compatible with each other.

On the other hand, in accordance with a stripping solution not containing (B) a basic compound having a prescribed structure, or a stripping solution containing (A) hydrofluoric acid and (B) a basic compound having a prescribed structure but having a pH in the range of more than 6.0, even when residual materials of a photoresist pattern and etching residual materials can be stripped away well, an anticorrosion margin (anticorrosion properties with a lapse of time) on an aluminum wiring is lowered.

In addition, according to comparison of Examples 1 and 2 with Comparative Examples 2 and 3, it is understood that with respect to a stripping solution containing (A) hydrofluoric acid and (B) a basic compound having a prescribed structure, when its pH is adjusted to not more than 6.0, the corrosion of SiO$_2$ is conspicuously suppressed.

Similar to Examples 1 and 2, stripping solutions were prepared in accordance with compositions and amounts blended as shown in the following Tables 3 and 4. Values in parentheses in the tables represent a part by mass. In addition, pH values of the stripping solutions of the respective Examples and Comparative Examples in the tables are values measured at 23° C. In addition, the addition amount of the pH adjuster was adjusted such that the pH of the stripping solution of each of the Examples and Comparative Examples was a value shown in each of Tables 3 and 4.

TABLE 3

| | Hydrofluoric acid | Basic compound | Water | Water-soluble organic solvent | pH | pH adjuster |
|---|---|---|---|---|---|---|
| Example 3 | HF (0.120) | DETA (0.050) | Water (25.000) | NMP (73.930) | 3.6 | MS |
| Example 4 | HF (0.120) | DETA (0.050) | Water (25.000) | NMP (74.130) | 4.6 | MS |
| Example 5 | HF (0.120) | DETA (0.050) | Water (25.000) | NMP (73.230) | 5.4 | CA |
| Example 6 | HF (0.120) | DETA (0.050) | Water (25.000) | NMP (73.730) | 5.7 | CA |
| Comparative example 4 | HF (0.120) | DETA (0.050) | Water (25.000) | NMP (74.130) | 6.4 | CA |
| Comparative example 5 | HF (0.120) | DETA (0.050) | Water (25.000) | NMP (74.130) | 7.5 | TEA |
| Comparative example 6 | HF (0.120) | DETA (0.050) | Water (25.000) | NMP (73.830) | 8.1 | TEA |
| Example 7 | HF (0.120) | DETA (0.050) | Water (25.000) | NMP (73.230) | 8.6 | TEA |
| Example 8 | HF (0.120) | DETA (0.050) | Water (25.000) | NMP (73.730) | 9.0 | MMA |
| Example 9 | HF (0.120) | DETA (0.050) | Water (25.000) | NMP (73.820) | 9.5 | MMA |
| Example 10 | HF (0.120) | DETA (0.050) | Water (25.000) | NMP (73.030) | 10.5 | MMA |

TABLE 4

| | Hydrofluoric acid | Basic compound | Water | Water-soluble organic solvent | pH | pH adjuster |
|---|---|---|---|---|---|---|
| Example 11 | HF (0.120) | TETA (0.027) | Water (25.000) | NMP (73.950) | 3.2 | MS |
| Example 12 | HF (0.120) | TETA (0.027) | Water (25.000) | NMP (74.190) | 4.4 | MS |
| Example 13 | HF | TETA | Water | NMP | 5.5 | AA |

TABLE 4-continued

|  | Hydrofluoric acid | Basic compound | Water | Water-soluble organic solvent | pH | pH adjuster |
|---|---|---|---|---|---|---|
|  | (0.120) | (0.027) | (25.000) | (69.250) |  |  |
| Comparative example 7 | HF (0.120) | TETA (0.027) | Water (25.000) | NMP (74.150) | 7.2 | TEA |
| Comparative example 8 | HF (0.120) | TETA (0.027) | Water (25.000) | NMP (73.850) | 8.0 | TEA |
| Example 14 | HF (0.120) | TETA (0.027) | Water (25.000) | NMP (73.250) | 8.7 | TEA |
| Example 15 | HF (0.120) | TETA (0.027) | Water (25.000) | NMP (73.750) | 9.6 | MMA |
| Example 16 | HF (0.120) | TETA (0.027) | Water (25.000) | NMP (73.050) | 10.4 | MMA |

Abbreviations in the foregoing Tables 3 and 4 are as shown below.
DETA: Diethylenetriamine
TETA: Triethylenetetramine
MS: Methanesulfonic acid
CA: Citric acid
AA: Acetic acid
TEA: Triethanolamine
MMA: N-Methylethanolamine
NMP: N-Methyl-2-pyrrolidone An amount of film shrinkage of $SiO_2$ (angstrom) in the case of using each of the stripping solutions is shown in the following Tables 5 and 6. In addition, a relation between a pH of the stripping solution and an amount of film shrinkage of $SiO_2$ (angstrom) measured by the above-described test is shown in a graph of FIG. 1.

TABLE 5

|  | pH | Amount of film shrinkage of $SiO_2$ (angstrom) |
|---|---|---|
| Example 3 | 3.6 | 2.5 |
| Example 4 | 4.6 | 3.0 |
| Example 5 | 5.4 | 25.0 |
| Example 6 | 5.7 | 56.5 |
| Comparative example 4 | 6.4 | 282.0 |
| Comparative example 5 | 7.5 | 552.5 |
| Comparative example 6 | 8.1 | 469.0 |
| Example 7 | 8.6 | 149.5 |
| Example 8 | 9.0 | 14.0 |
| Example 9 | 9.5 | 26.0 |
| Example 10 | 10.5 | 4.0 |

TABLE 6

|  | pH | Amount of film shrinkage of $SiO_2$ (angstrom) |
|---|---|---|
| Example 11 | 3.2 | 3.5 |
| Example 12 | 4.4 | 3.5 |
| Example 13 | 5.5 | 67.0 |
| Comparative example 7 | 7.2 | 318.5 |
| Comparative example 8 | 8.0 | 205.0 |
| Example 14 | 8.7 | 133.0 |
| Example 15 | 9.6 | 8.5 |
| Example 16 | 10.4 | 3.5 |

Figure 2:
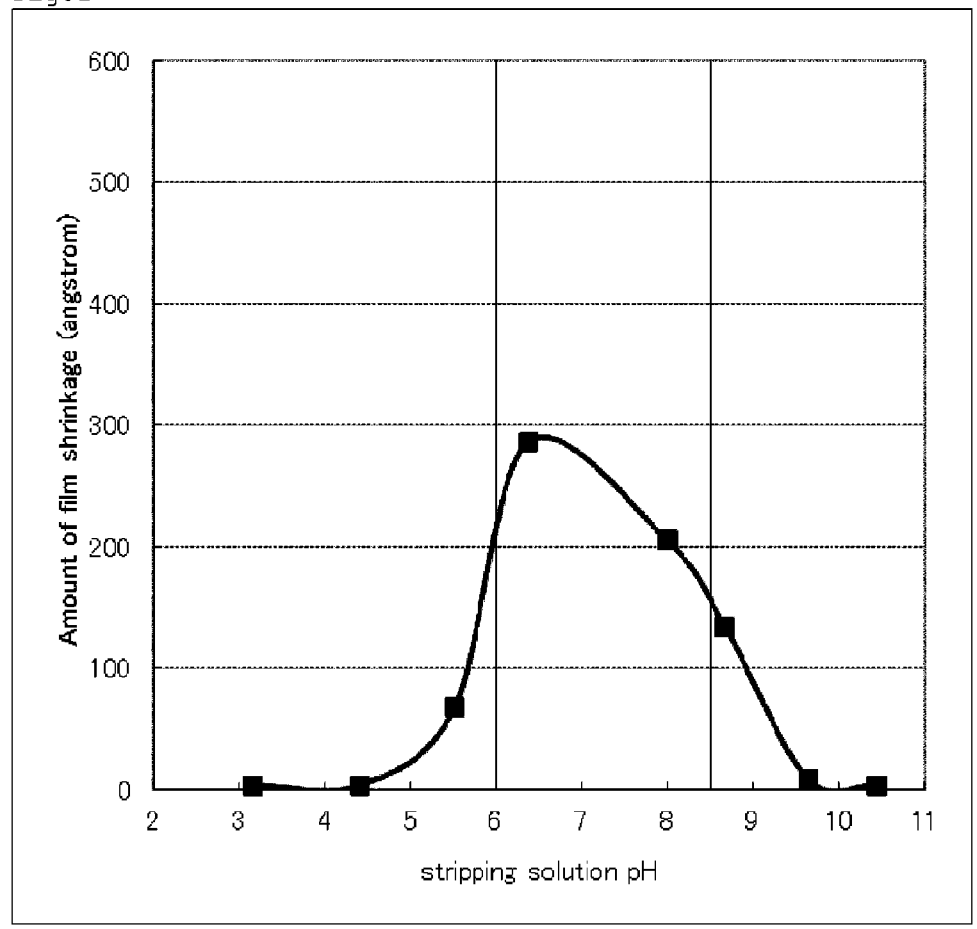
FIG. 2 is a graph showing a relation between a pH of a stripping solution containing triethylenetetramine and an amount of film shrinkage of $SiO_2$ in the case of immersing a substrate made of $SiO_2$ as a material quality of the surface thereof in the stripping solution.

According to Tables 5 and 6 and the graphs shown in FIGS. 1 and 2, it is understood that with respect to a stripping solution containing (A) hydrofluoric acid and (B) a basic compound having a specified structure, when its pH is adjusted to not more than 6.0 or 8.5 or more, the corrosion of $SiO_2$ tends to be conspicuously suppressed.

Evaluation of Anticorrosion Properties on Metal Material

In the case of immersing a substrate made of Al—Si—Cu as a material quality of the surface thereof in each of the stripping solutions of Example 3, Examples 8 to 9, and Comparative Example 5 in a beaker, an amount of film shrinkage (angstrom) of the substrate surface was measured. In addition, in the case of immersing a substrate made of $Al_2O_3$ as a material quality of the surface thereof in each of the stripping solutions of Example 12, Example 13, Example 16, Comparative Example 7, and Comparative Example 8 in a beaker, an amount of film shrinkage (angstrom) of the substrate surface was measured. An immersion treatment temperature was 35° C., and an immersion time was 30 minutes. After the immersion treatment of the substrate in the stripping solution, the substrate was cleaned with ion-exchanged distilled water, a nitrogen gas was sprayed onto the cleaned substrate, and the substrate was dried.

With respect to the substrate made of Al—Si—Cu as a material quality of the surface thereof, a relation between a pH of the stripping solution and an amount of film shrinkage (angstrom) measured by the above-described test is shown in Table 7. With respect to the substrate made of $Al_2O_3$ as a material quality of the surface thereof, a relation between a pH of the stripping solution and an amount of film shrinkage (angstrom) measured by the above-described test is shown in Table 8.

TABLE 7

|  | pH | Amount of film shrinkage of Al—Si—Cu(angstrom) |
|---|---|---|
| Example 3 | 3.6 | 7.8 |
| Comparative example 5 | 7.5 | 23.7 |
| Example 8 | 9.0 | 4.2 |
| Example 9 | 9.5 | 3.3 |

TABLE 8

|  | pH | Amount of film shrinkage of Al—Si—Cu(angstrom) |
|---|---|---|
| Example 12 | 4.4 | 13.0 |
| Example 13 | 5.5 | 55.0 |
| Comparative example 7 | 7.2 | 81.5 |
| Comparative example 8 | 8.0 | 110.5 |
| Example 16 | 10.4 | 66.5 |

According to Tables 7 and 8, it is understood that with respect to a stripping solution containing (A) hydrofluoric acid and (B) a basic compound having a specified structure, when its pH is not more than 6.0 or 8.5 or more, the corrosion on $Al_2O_3$ and Al—Si—Cu tends to be conspicuously suppressed.

With respect to the substrate made of Cu as a material quality of the surface thereof, the same experiment as that in Al—Si—Cu and $Al_2O_3$ was carried out using each of the stripping solutions of Example 1, Example 2, and Comparative Example 1. With respect to the substrate made of Cu as a material quality of the surface thereof, a relation between a pH of the stripping solution and an amount of film shrinkage (angstrom) measured by the above-described test is shown in Table 9.

TABLE 9

| | pH | Amount of film shrinkage of Cu(angstrom) |
|---|---|---|
| Comparative example 1 | 5.5 | 20.0 |
| Example 1 | 5.7 | <1.0 |
| Example 2 | 5.4 | <1.0 |

According to Table 9, it is understood that in accordance with a stripping solution not containing (B) a basic compound having a prescribed structure, even when the its pH is not more than 6.0, the corrosion of Cu is generated. On the other hand, in accordance with a stripping solution having a pH adjusted to not more than 6.0 and containing (A) hydrofluoric acid and (B) a basic compound having a specified structure, the corrosion of Cu is not substantially generated.

From the foregoing results, it is understood that in accordance with a stripping solution containing (A) hydrofluoric acid and (B) a basic compound having a prescribed structure and having a pH adjusted to not more than 6.0 or 8.5 or more, it is possible to make both good stripping of residual materials of a photoresist pattern and etching residual materials and anticorrosion of a variety of metal materials, for example, $SiO_2$, $Al_2O_3$, and Cu, and an aluminum wiring compatible with each other.

DESCRIPTION OF REFERENCE AND SIGNS

10: $SiO_2$ film
11: Aluminum wiring (wiring of Al having Cu added thereto)
12: Surface oxide film ($Al_2O_3$)
13: TiN thin film
14: Residual materials While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A stripping solution for photolithography comprising (A) hydrofluoric acid, (B) a basic compound represented by the following general formula (b-1), and (C) water, and having a pH at 23° C. of not more than 6.0, or 8.5 or more:

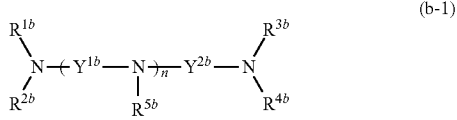

(b-1)

wherein
$R^{1b}$ to $R^{5b}$ each independently represent a hydrogen atom or an alkyl group having from 1 to 6 carbon atoms, which may be substituted with a hydroxyl group, a carboxyl group, an amino group, or a phosphonic acid group, provided that at least one of $R^{1b}$ to $R^{5b}$ represents a hydrogen atom, and one of $R^{1b}$ to $R^{4b}$ may bind with $R^{5b}$ to form a ring structure;

$Y^{1b}$ and $Y^{2b}$ each independently represent an alkylene group having from 1 to 3 carbon atoms;
n is an integer of from 1 to 5; and
when n is 2 or greater, a plurality of $R^{5b}$s may be the same as or different from each other, a plurality of $Y^{1b}$s may be the same as or different from each other, and $R^{5b}$s may bind with each other to form a ring structure, wherein a content of (B) the basic compound in the stripping solution is from 0.01 to 2.00% by mass.

2. The stripping solution for photolithography according to claim 1, further comprising (D) a pH adjuster.

3. The stripping solution for photolithography according to claim 1, further comprising (E) a water-soluble organic solvent.

4. The stripping solution for photolithography according to claim 1, wherein a ratio of the normality of the basic compound to the normality of the hydrofluoric acid is from 0.1 to 3.0.

5. The stripping solution for photolithography according to claim 1, wherein the stripping solution is used for forming a metal wiring pattern on a substrate provided with an insulating film made of $SiO_2$.

6. The stripping solution for photolithography according to claim 1, wherein $R^{1b}$ to $R^{5b}$ each independently represent a hydrogen atom or an alkyl group having from 1 to 6 carbon atoms, which may be substituted with a hydroxyl group or an amino group.

7. The stripping solution for photolithography according to claim 1, wherein (B) the basic compound represented by the general formula (b-1) is a compound represented by the following general formula (b-2):

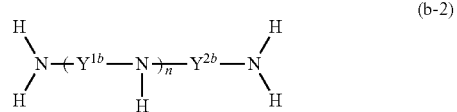

(b-2)

wherein, $Y^{1b}$, $Y^{2b}$ and n are as defined in the general formula (b-1).

8. A method of forming a pattern, comprising etching a substrate using a photoresist pattern provided on the substrate as a mask; then ashing the photoresist pattern; and thereafter stripping away residual materials of the photoresist pattern and etching residual materials using the stripping solution for photolithography according to claim 1.

9. A stripping solution for photolithography comprising (A) hydrofluoric acid, (B) a basic compound represented by the following general formula (b-1), and (C) water and having a pH at 23° C. of not more than 6.0 or 8.5 or more:

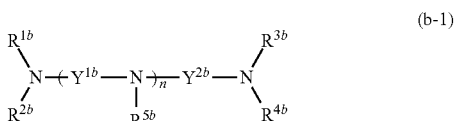

(b-1)

wherein
$R^{1b}$ to $R^{5b}$ each independently represent a hydrogen atom or an alkyl group having from 1 to 6 carbon atoms, which may be substituted with a hydroxyl group, a carboxyl group, or an amino group, provided that at least one of $R^{1b}$ to $R^{5b}$ represents a hydrogen atom, and one of $R^{1b}$ to $R^{4b}$ may bind with $R^{5b}$ to form a ring structure;

$Y^{1b}$ and $Y^{2b}$ each independently represent an alkylene group having from 1 to 3 carbon atoms;

n is an integer of from 1 to 5; and when n is 2 or greater, a plurality of $R^{5b}$s may be the same as or different from each other, a plurality of $Y^{1b}$s may be the same as or different from each other, and $R^{5b}$s may bind with each other to form a ring structure, and a content of (B) the basic compound in the stripping solution is from 0.01 to 2.00% by mass.

10. A method of forming a pattern, comprising etching a substrate using a photoresist pattern provided on the substrate as a mask; then ashing the photoresist pattern; and thereafter stripping away residual materials of the photoresist pattern and etching residual materials using the stripping solution for photolithography according to claim 9.

* * * * *